United States Patent
Ohashi

(10) Patent No.: US 11,285,981 B2
(45) Date of Patent: Mar. 29, 2022

(54) TRAIN COMMUNICATION SYSTEM AND VEHICLE-MOUNTED DEVICE

(71) Applicant: Mitsubishi Electric Corporation, Tokyo (JP)

(72) Inventor: Satoru Ohashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 691 days.

(21) Appl. No.: 16/318,732

(22) PCT Filed: Jul. 25, 2016

(86) PCT No.: PCT/JP2016/071729
§ 371 (c)(1),
(2) Date: Jan. 18, 2019

(87) PCT Pub. No.: WO2018/020551
PCT Pub. Date: Feb. 1, 2018

(65) Prior Publication Data
US 2019/0241201 A1 Aug. 8, 2019

(51) Int. Cl.
*B61L 15/00* (2006.01)
*B60L 15/42* (2006.01)
(Continued)

(52) U.S. Cl.
CPC ........... *B61L 15/0018* (2013.01); *B60L 15/00* (2013.01); *B60L 15/42* (2013.01); *B61L 15/0036* (2013.01);
(Continued)

(58) Field of Classification Search
CPC ............. B61L 15/0018; B61L 15/0036; B61L 15/0072; B61L 2205/00; B60L 15/00; B60L 15/62; H03M 9/00; Y02T 90/16
See application file for complete search history.

(56) References Cited

U.S. PATENT DOCUMENTS 8,935,022 B2 * 1/2015 Cooper ............. H04L 12/40169
701/19
2008/0159281 A1 * 7/2008 Jesseph ............... H04L 12/4604
370/389
(Continued)

FOREIGN PATENT DOCUMENTS

EP 2 383 162 A1 11/2011
JP 2004364411 A 12/2004
(Continued)

OTHER PUBLICATIONS

Extended European Search Report dated May 6, 2019, issued by the European Patent Office in corresponding European Application No. 16910455.1 (9 pages).
(Continued)

*Primary Examiner* — Russell Frejd
(74) *Attorney, Agent, or Firm* — Buchanan Ingersoll & Rooney PC

(57) ABSTRACT

A train communication system which performs communication between a vehicle-mounted device and a TCMS includes one or a plurality of the vehicle-mounted devices and the TCMS. The vehicle-mounted device converts a signal to the TCMS into a signal in a network transmission format which is a format used for transmission over a network connectable by a plurality of vehicle-mounted devices and transmits the signal via the network and converts a signal in the network transmission format received from the TCMS via the network into a signal in an original format. The TCMS converts a signal to the vehicle-mounted device into a signal in the network transmission format and transmits the signal via the network, and converts a signal in the network transmission format received from the vehicle-mounted device via the network into a signal in an original format.

10 Claims, 9 Drawing Sheets

(51) Int. Cl.
*B60L 15/00* (2006.01)
*H03M 9/00* (2006.01)

(52) U.S. Cl.
CPC ........... *B61L 15/0072* (2013.01); *H03M 9/00* (2013.01); *B61L 2205/00* (2013.01); *Y02T 90/16* (2013.01)

(56) References Cited

U.S. PATENT DOCUMENTS

| | | | |
|---|---|---|---|
| 2009/0050380 A1* | 2/2009 | Leignel | H04L 12/403 180/14.1 |
| 2010/0091663 A1* | 4/2010 | Takeyama | H04L 49/602 370/242 |
| 2011/0286464 A1 | 11/2011 | Shigeeda et al. | |
| 2014/0156135 A1 | 6/2014 | Maki et al. | |
| 2019/0135313 A1* | 5/2019 | Yamamura | B60L 15/42 |

FOREIGN PATENT DOCUMENTS

| | | |
|---|---|---|
| JP | 2013059210 A | 3/2013 |
| JP | 2014075656 A | 4/2014 |
| JP | 2014110671 A | 6/2014 |
| WO | 2010087258 A1 | 8/2010 |

OTHER PUBLICATIONS

International Search Report (with English translation) and Written Opinion issued in corresponding International Patent Application No. PCT/JP2016/071729, 9 pages (dated Oct. 25, 2016).
Notification of Reasons for Refusal (with English translation) issued in Japanese Patent Application No. 2017-532197, 6 pages (dated Jul. 24, 2017).

* cited by examiner

TRAIN COMMUNICATION SYSTEM AND VEHICLE-MOUNTED DEVICE

FIELD

The present invention relates to a train communication system which includes a vehicle-mounted device and a vehicle information control apparatus, the vehicle-mounted device, the vehicle information control apparatus, and a signal conversion method.

BACKGROUND

Conventionally, many vehicle-mounted devices are connected to a cab of a vehicle. In the cab, a vehicle information control apparatus such as a Train Control and Monitoring System (TCMS) requires wiring to each vehicle-mounted device for each signal. Consequently, the vehicle information control apparatus includes many wires, a great deal of labor is required for manufacture thereof, and workability is bad. In addition, since the vehicle information control apparatus requires a connection terminal for each signal, there is a problem that a circuit scale increases.

In response to such a problem, Patent Literature 1 discloses a technique in which each vehicle-mounted device transmits a signal to a vehicle information control apparatus by Remote Input/output (RIO). In the technique described in Patent Literature 1, a vehicle-mounted device connected to the vehicle information control apparatus converts a signal for a switch or the like into a serial signal and transmits the serial signal. In the vehicle information control apparatus described in Patent Literature 1, since the number of wires can be reduced, workability at the time of manufacture is improved, and since the number of connection terminals can be reduced, the size of the vehicle information control apparatus can be prevented from increasing.

CITATION LIST

Patent Literature

Patent Literature 1: Japanese Patent Application Laid-open No. 2004-364411

SUMMARY

Technical Problem

However, although the vehicle information control apparatus can reduce the number of wires to each vehicle-mounted device according to the above conventional technique, there has been a tendency in recent years that the number of vehicle-mounted devices such as display devices for in-vehicle guide or advertisement display increases in vehicles, and connection terminals, the number of which is corresponding to the number of vehicle-mounted devices to be connected, are necessary. Therefore, in the vehicle information control apparatus, there is a problem that when the number of vehicle-mounted devices to be connected is large, the circuit scale increases, which results in increase in size of the vehicle information control apparatus.

The present invention has been made in view of the above, and an object thereof is to obtain a train communication system which can prevent a vehicle information control apparatus from increasing in size regardless of the number of vehicle-mounted devices to be connected.

Solution to Problem

In order to solve the above-described problem and achieve the object, in a train communication system that performs communication between a vehicle-mounted device and a vehicle information control apparatus, the train communication system of the present invention includes one or a plurality of the vehicle-mounted devices to convert a signal to the vehicle information control apparatus into a signal in a network transmission format that is a format used for transmission over a network connectable by the plurality of the vehicle-mounted devices and transmit the signal via the network, and to convert a signal in the network transmission format received from the vehicle information control apparatus via the network into a signal in an original format. Additionally, the train communication system of the present invention includes the vehicle information control apparatus to convert a signal to the vehicle-mounted device into a signal in the network transmission format and transmit the signal via the network, and to convert a signal in the network transmission format received from the vehicle-mounted device via the network into a signal in an original format.

Advantageous Effects of Invention

According to the present invention, it is possible to prevent an increase in size of a vehicle information control apparatus regardless of the number of vehicle-mounted devices to be connected.

DESCRIPTION OF EMBODIMENTS

Hereinafter, a train communication system, a vehicle-mounted device, a vehicle information control apparatus, and a signal conversion method according to an embodiment of the present invention will be described in detail with reference to the drawings. The invention is not limited to the embodiment.

Embodiment

Figure 1:
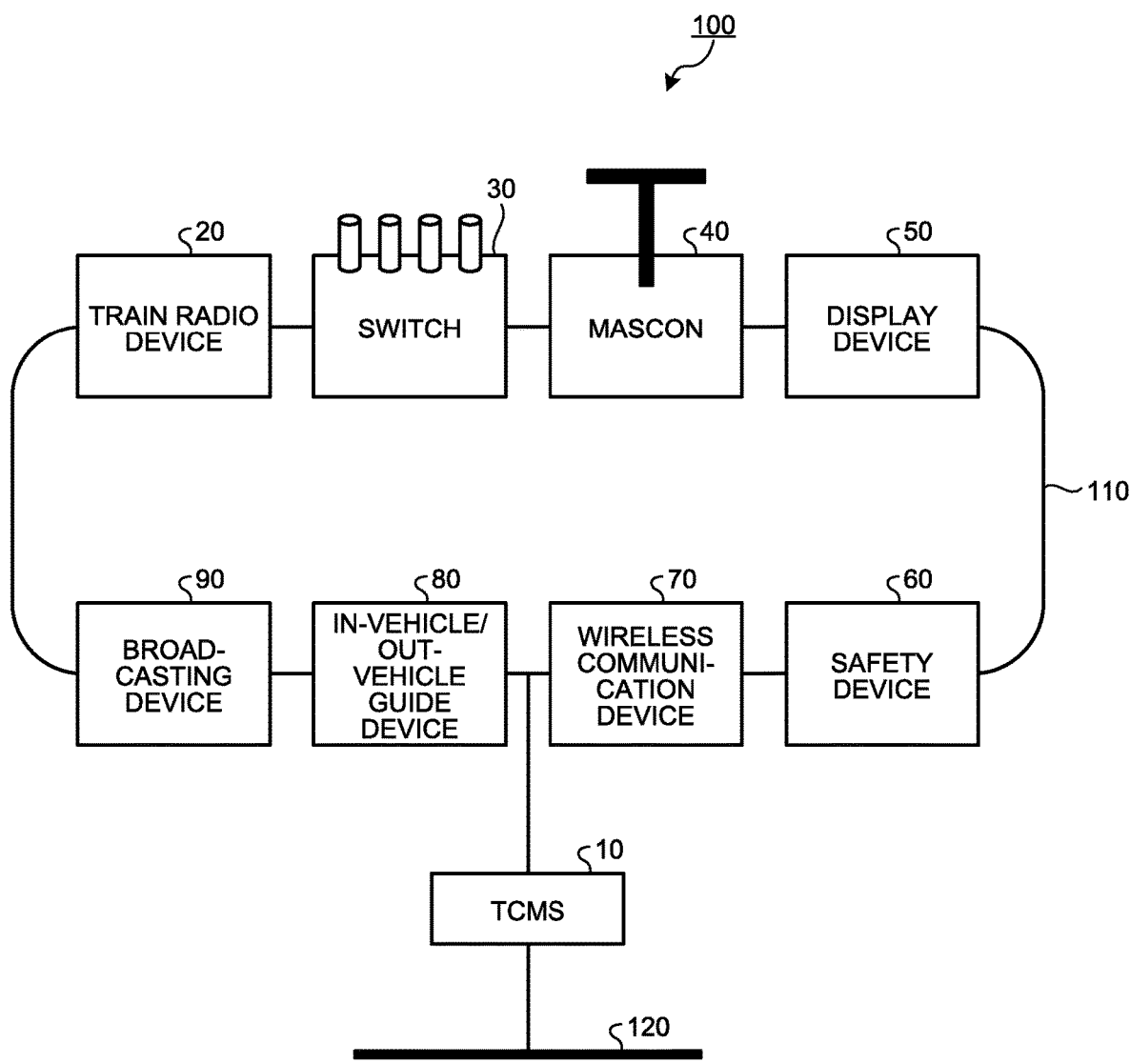
FIG. 1 is a diagram illustrating a configuration example of a train communication system.

FIG. 1 is a diagram illustrating a configuration example of a train communication system 100 according to an embodiment of the present invention. The train communication system 100 includes a TCMS 10, a train radio device 20, a switch 30, a master control (hereinafter referred to as a mascon) 40, a display device 50, a safety device 60, a wireless communication device 70, an in-vehicle/out-vehicle guide device 80, and a broadcasting device 90. In the train communication system 100, the TCMS 10, which is a vehicle information control apparatus, connects to the train radio device 20, the switch 30, the mascon 40, the display device 50, the safety device 60, the wireless communication device 70, the in-vehicle/out-vehicle guide device 80, and the broadcasting device 90, which are vehicle-mounted devices, and transmits and receives signals to and from each vehicle-mounted device. As illustrated in FIG. 1, the train communication system 100 constitutes a ring-type network 110. The network 110 is a network connectable by a plurality of vehicle-mounted devices. Since the ring-type network 110 includes each of the vehicle-mounted devices, the TCMS 10 can connect to the ring-type network 110 by one signal line to transmit and receive signals to and from each of the vehicle-mounted devices.

Figure 2:
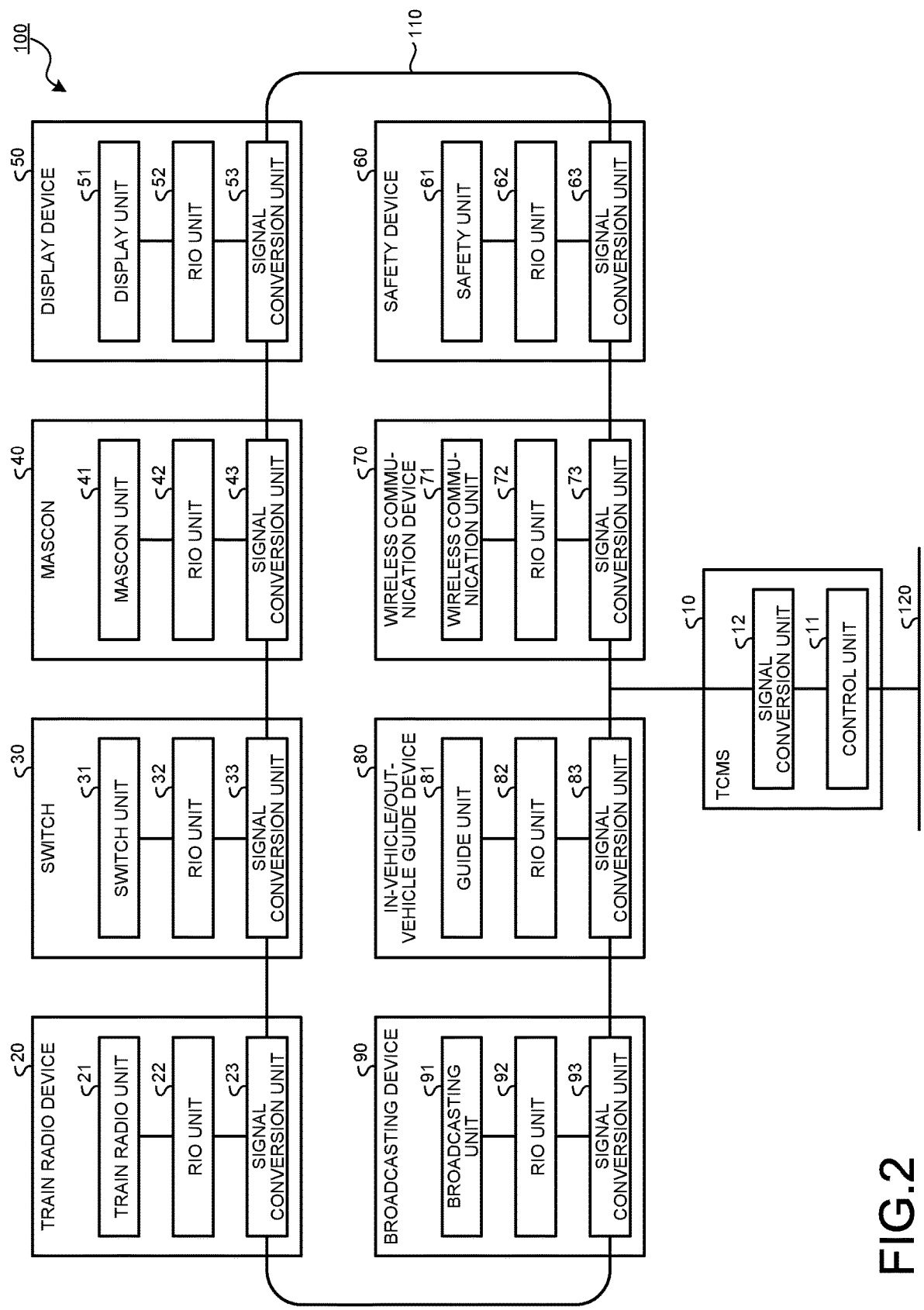
FIG. 2 is a block diagram illustrating a configuration example of a TCMS and each vehicle-mounted device constituting the train communication system.

FIG. 2 is a block diagram illustrating a configuration example of the TCMS 10 and each vehicle-mounted device constituting the train communication system 100 according to the embodiment of the present invention.

The TCMS 10 includes a control unit 11 and a signal conversion unit 12. The control unit 11 operates as a general TCMS, and transmits and receives signals to and from each vehicle-mounted device via the signal conversion unit 12. For example, the control unit 11 performs operations including outputting a signal received from an external operation management system (not illustrated) or the like to the signal conversion unit 12, and transferring a signal to the operation management system based on a signal input from a vehicle-mounted device via the network 110 and the signal conversion unit 12. When transmitting and receiving signals to and from the operation management system or the like, the control unit 11 performs the transmission and reception via a network 120 different from the network 110.

The signal conversion unit 12 is an apparatus-side signal conversion unit which converts a signal to a vehicle-mounted device input from the control unit 11 into a signal in a network transmission format which is a format used for transmission over the network 110 and transmits the signal to the network 110, that is, the vehicle-mounted device as a destination. In addition, the signal conversion unit 12 converts a signal in the network transmission format received from a vehicle-mounted device via the network 110 into a signal usable by a general TCMS, that is, a signal in an original format before being converted into the signal in the network transmission format in the vehicle-mounted device as a source. In the present embodiment, a description will be given assuming that as an example, the signal in the network transmission format which is a format used for transmission over the network 110 is a signal of an Ethernet (registered trademark) frame, but there is no limitation thereto. In the present embodiment, the train communication system 100 performs a process for converting a signal conventionally directly transmitted and received between a vehicle-mounted device and the TCMS 10 into an Ethernet (registered trademark) frame, transmitting the converted Ethernet frame to a destination via the network 110, and converting the Ethernet (registered trademark) frame back to a signal in an original format at the destination which has received the Ethernet (registered trademark) frame.

As described above, the TCMS 10 is configured to include, in addition to the control unit 11 which performs operations as a general TCMS, the signal conversion unit 12 which converts a format of a signal when the signal is transmitted to and received from each vehicle-mounted device via the network 110.

The train radio device 20 includes a train radio unit 21, an RIO unit 22, and a signal conversion unit 23. The train radio unit 21 is an operation unit which performs voice or data communication between a train operator and a ground-side operation manager and the like. The train radio unit 21 outputs, to the RIO unit 22, information such as voice or data input by the operator as a signal and outputs information such as voice or data input from the TCMS 10 via the signal conversion unit 23 and the RIO unit 22.

The RIO unit 22 is a serial/parallel conversion unit which converts a signal input from the train radio unit 21 into a serial signal, and outputs the serial signal to the signal conversion unit 23. In addition, the RIO unit 22 converts a signal input from the TCMS 10 via the signal conversion unit 23 into a parallel signal, and outputs the parallel signal to the train radio unit 21.

The signal conversion unit 23 is a device-side signal conversion unit which converts a serial signal input from the RIO unit 22 into a signal in the network transmission format and transmits the signal to the TCMS 10 via the network 110. In addition, the signal conversion unit 23 converts a signal in the network transmission format received from the TCMS 10 via the network 110 into a signal usable by the train radio unit 21, that is, a signal in an original format before being converted into the signal in the network transmission format in the TCMS 10 as a source, and outputs the signal to the RIO unit 22.

As described above, the train radio device 20 is obtained by adding the signal conversion unit 23, which converts a format of a signal when the signal is transmitted to and received from the TCMS 10 via the network 110, to the configuration of the train radio unit 21 which operates as a general train radio device and the RIO unit 22.

The switch 30 includes a switch unit 31, an RIO unit 32, and a signal conversion unit 33. The switch unit 31 is an operation unit which outputs a content of a switching operation such as opening/closing of a door of a vehicle, turning ON/OFF of a headlamp, or the like, as a signal.

The RIO unit 32 is a serial/parallel conversion unit which converts a signal input from the switch unit 31 into a serial signal, and outputs the serial signal to the signal conversion unit 33. In addition, the RIO unit 32 converts a signal input from the TCMS 10 via the signal conversion unit 33 into a parallel signal, and outputs the parallel signal to the switch unit 31.

The signal conversion unit 33 is a device-side signal conversion unit which converts a serial signal input from the RIO unit 32 into a signal in the network transmission format and transmits the signal to the TCMS 10 via the network 110. In addition, the signal conversion unit 33 converts a signal in the network transmission format received from the TCMS 10 via the network 110 into a signal usable by the switch unit 31, that is, a signal in an original format before being converted into the signal in the network transmission format in the TCMS 10 as a source, and outputs the signal to the RIO unit 32.

As described above, the switch 30 is obtained by adding the signal conversion unit 33, which converts a format of a signal when the signal is transmitted to and received from the TCMS 10 via the network 110, to the configuration of the switch unit 31 which operates as a general switch and the RIO unit 32.

The mascon 40 includes a mascon unit 41, an RIO unit 42, and a signal conversion unit 43. The mascon unit 41 is an operation unit which controls the speed of the vehicle and the like by an operation of the operator and outputs the content of the control as a signal.

The RIO unit 42 is a serial/parallel conversion unit which converts a signal input from the mascon unit 41 into a serial signal, and outputs the serial signal to the signal conversion unit 43. In addition, the RIO unit 42 converts a signal input from the TCMS 10 via the signal conversion unit 43 into a parallel signal, and outputs the parallel signal to the mascon unit 41.

The signal conversion unit 43 is a device-side signal conversion unit which converts a serial signal input from the RIO unit 42 into a signal in the network transmission format and transmits the signal to the TCMS 10 via the network 110. In addition, the signal conversion unit 43 converts a signal in the network transmission format received from the TCMS 10 via the network 110 into a signal usable by the mascon unit 41, that is, a signal in an original format before being converted into the signal in the network transmission format in the TCMS 10 as a source, and outputs the signal to the RIO unit 42.

As described above, the mascon 40 is obtained by adding the signal conversion unit 43, which converts a format of a signal when the signal is transmitted to and received from the TCMS 10 via the network 110, to the configuration of the mascon unit 41 which operates as a general mascon and the RIO unit 42.

The display device 50 includes a display unit 51, an RIO unit 52, and a signal conversion unit 53. The display unit 51 is, for example, a meter of a Liquid Crystal Display (LCD) and is an operation unit which displays the speed and brake pressure of the vehicle, and the like. The display unit 51 displays information on the speed and brake pressure of the vehicle, and the like, input from the TCMS 10 via the signal conversion unit 53 and the RIO unit 52.

The RIO unit 52 is a serial/parallel conversion unit which converts a signal input from the display unit 51 into a serial signal and outputs the serial signal to the signal conversion unit 53. In addition, the RIO unit 52 converts a signal input from the TCMS 10 via the signal conversion unit 53 into a parallel signal, and outputs the parallel signal to the display unit 51.

The signal conversion unit 53 is a device-side signal conversion unit which converts a serial signal input from the RIO unit 52 into a signal in the network transmission format and transmits the signal to the TCMS 10 via the network 110. In addition, the signal conversion unit 53 converts a signal in the network transmission format received from the TCMS 10 via the network 110 into a signal usable by the display unit 51, that is, a signal in an original format before being converted into the signal in the network transmission format in the TCMS 10 as a source.

As described above, the display device 50 is obtained by adding the signal conversion unit 53, which converts a format of a signal when the signal is transmitted to and received from the TCMS 10 via the network 110, to the configuration of the display unit 51 which operates as a general display device and the RIO unit 52.

The safety device 60 includes a safety unit 61, an RIO unit 62, and a signal conversion unit 63. The safety unit 61 is an operation unit which displays, to the operator, signal information on go or stop of the vehicle and information on a speed limit of the vehicle, and the like. The safety unit 61 displays signal information, information on the vehicle speed limit, and the like, input from the TCMS 10 via the signal conversion unit 63 and the RIO unit 62.

The RIO unit 62 is a serial/parallel conversion unit which converts a signal input from the safety unit 61 into a serial signal and outputs the serial signal to the signal conversion unit 63. In addition, the RIO unit 62 converts a signal input from the TCMS 10 via the signal conversion unit 63 into a parallel signal, and outputs the parallel signal to the safety unit 61.

The signal conversion unit 63 is a device-side signal conversion unit which converts a serial signal input from the RIO unit 62 into a signal in the network transmission format and transmits the signal to the TCMS 10 via the network 110. In addition, the signal conversion unit 63 converts a signal in the network transmission format received from the TCMS 10 via the network 110 into a signal usable by the safety unit 61, that is, a signal in an original format before being converted into the signal in the network transmission format in the TCMS 10 as a source.

As described above, the safety device 60 is obtained by adding the signal conversion unit 63, which converts a format of a signal when the signal is transmitted to and received from the TCMS 10 via the network 110, to the configuration of the safety unit 61 which operates as a general safety device and the RIO unit 62.

The wireless communication device 70 includes a wireless communication unit 71, an RIO unit 72, and a signal conversion unit 73. The wireless communication unit 71 is an operation unit which acquires data of content for advertisement, and the like. The wireless communication unit 71 displays data and the like input from the TCMS 10 via the signal conversion unit 73 and the RIO unit 72 on a monitor (not illustrated) or the like. As for the monitor, it is also possible to use a monitor common to a guide unit 81 of the in-vehicle/out-vehicle guide device 80 described later.

The RIO unit 72 is a serial/parallel conversion unit which converts a signal input from the wireless communication unit 71 into a serial signal and outputs the serial signal to the signal conversion unit 73. In addition, the RIO unit 72 converts a signal input from the TCMS 10 via the signal conversion unit 73 into a parallel signal, and outputs the parallel signal to the wireless communication unit 71.

The signal conversion unit 73 is a device-side signal conversion unit which converts a serial signal input from the RIO unit 72 into a signal in the network transmission format and transmits the signal to the TCMS 10 via the network 110. In addition, the signal conversion unit 73 converts a signal in the network transmission format received from the TCMS 10 via the network 110 into a signal usable by the wireless communication unit 71, that is, a signal in an original format before being converted into the signal in the network transmission format in the TCMS 10 as a source.

As described above, the wireless communication device 70 is obtained by adding the signal conversion unit 73, which converts a format of a signal when the signal is transmitted to and received from the TCMS 10 via the network 110, to the configuration of the wireless communication unit 71 which operates as a general wireless communication device and the RIO unit 72.

The in-vehicle/out-vehicle guide device 80 includes the guide unit 81, an RIO unit 82, and a signal conversion unit 83. The guide unit 81 is an operation unit which displays information on a destination, a next stop, a route map, and the like. The guide unit 81 displays information on a destination, a next stop, a route map, and the like, input from the TCMS 10 via the signal conversion unit 83 and the RIO unit 82.

The RIO unit 82 is a serial/parallel conversion unit which converts a signal input from the guide unit 81 into a serial signal and outputs the serial signal to the signal conversion unit 83. In addition, the RIO unit 82 converts a signal input from the TCMS 10 via the signal conversion unit 83 into a parallel signal, and outputs the parallel signal to the guide unit 81.

The signal conversion unit 83 is a device-side signal conversion unit which converts a serial signal input from the RIO unit 82 into a signal in the network transmission format and transmits the signal to the TCMS 10 via the network 110. In addition, the signal conversion unit 83 converts a signal in the network transmission format received from the TCMS 10 via the network 110 into a signal usable by the guide unit 81, that is, a signal in an original format before being converted into the signal in the network transmission format in the TCMS 10 as a source.

As described above, the in-vehicle/out-vehicle guide device 80 is obtained by adding the signal conversion unit 83, which converts a format of a signal when the signal is transmitted to and received from the TCMS 10 via the network 110, to the configuration of the guide unit 81 which operates as a general in-vehicle/out-vehicle guide device and the RIO unit 82.

The broadcasting device 90 includes a broadcasting unit 91, an RIO unit 92, and a signal conversion unit 93. The broadcasting unit 91 is an operation unit which automatically broadcasts voice information on directions for a next station, directions for arrival at a station, and the like. The broadcasting unit 91 automatically broadcasts voice information on directions for a next station, directions for arrival at a station, and the like, input from the TCMS 10 via the signal conversion unit 93 and the RIO unit 92.

The RIO unit 92 is a serial/parallel conversion unit which converts a signal input from the broadcasting unit 91 into a serial signal and outputs the serial signal to the signal conversion unit 93. In addition, the RIO unit 92 converts a signal input from the TCMS 10 via the signal conversion unit 93 into a parallel signal, and outputs the parallel signal to the broadcasting unit 91.

The signal conversion unit 93 is a device-side signal conversion unit which converts a serial signal input from the RIO unit 92 into a signal in the network transmission format and transmits the signal to the TCMS 10 via the network 110. In addition, the signal conversion unit 93 converts a signal in the network transmission format received from the TCMS 10 via the network 110 into a signal usable by the broadcasting unit 91, that is, a signal in an original format before being converted into the signal in the network transmission format in the TCMS 10 as a source.

As described above, the broadcasting device 90 is obtained by adding the signal conversion unit 93, which converts a format of a signal when the signal is transmitted to and received from the TCMS 10 via the network 110, to the configuration of the broadcasting unit 91 which operates as a general broadcasting device and the RIO unit 92.

In FIGS. 1 and 2, the train communication system 100 includes different types of vehicle-mounted devices, one device for each type, but this is merely an example, and it is also possible to include a plurality of vehicle-mounted devices of the same type. The train communication system 100 may be configured such that the TCMS 10 is connected only to one vehicle-mounted device. Although the TCMS 10 is connected to the network 110 by one connection line in FIGS. 1 and 2, a configuration may be employed in which the TCMS 10 is included in a ring-shaped system, that is, the TCMS 10 is arranged between the wireless communication device 70 and the in-vehicle/out-vehicle guide device 80.

Figure 3:
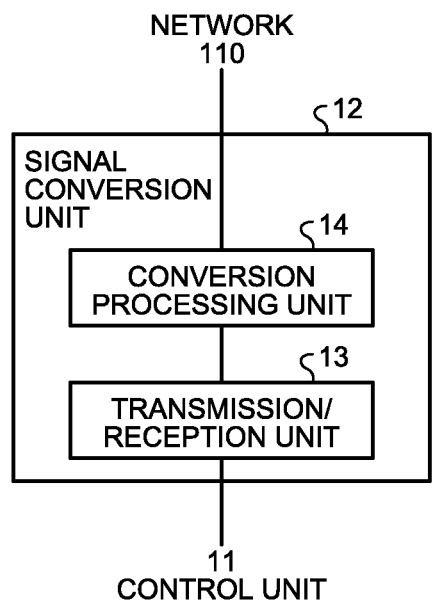
FIG. 3 is a block diagram illustrating a configuration example of a signal conversion unit included in the TCMS.

FIG. 3 is a block diagram illustrating a configuration example of the signal conversion unit 12 included in the TCMS 10 according to the embodiment of the present invention. The signal conversion unit 12 includes a conversion processing unit 13 and a transmission/reception unit 14.

The conversion processing unit 13 is an apparatus-side conversion processing unit which converts a signal input from the control unit 11 into a signal in the network transmission format by performing data format conversion and transmission format conversion, and outputs the signal to the transmission/reception unit 14. In addition, the conversion processing unit 13 converts a signal in the network transmission format received by the transmission/reception unit 14 into a signal in an original format by performing transmission format conversion and data format conversion, and outputs the signal to the control unit 11.

Specifically, when a signal is input from the control unit 11, the conversion processing unit 13 first converts the signal input from the control unit 11 into an internal processing format for data conversion. With respect to signals converted into the internal processing format, for example, regarding signals directed to the train radio device 20 and the broadcasting device 90, the conversion processing unit 13 converts data formats thereof by protocol conversion. With respect to signals converted into the internal processing format, for example, regarding train information as signals directed to the switch 30, the display device 50, the safety device 60, the wireless communication device 70, and the in-vehicle/out-vehicle guide device 80, the conversion processing unit 13 converts data formats thereof to obtain digital signals in a format storable in a data portion of an Ethernet (registered trademark) frame after transmission format conversion described later. Then, the conversion processing unit 13 provides the data after the data format conversion with a header and the like to convert the data into an Ethernet (registered trademark) frame as the transmission format conversion, and outputs the Ethernet (registered trademark) frame to the transmission/reception unit 14. The conversion processing unit 13 provides information on a signal type, information on an address of the TCMS 10, that is, a source address, and the like, in the header.

When a signal in the network transmission format, that is, an Ethernet (registered trademark) frame is input from the transmission/reception unit 14, the conversion processing unit 13 first removes a header and the like from the Ethernet (registered trademark) frame input from the transmission/reception unit 14 to extract a data portion, and converts the data portion into the internal processing format. With respect to signals converted into the internal processing format, for example, regarding signals from the train radio device 20 and the broadcasting device 90, the conversion processing unit 13 converts data formats thereof by protocol conversion. With respect to signals converted into the internal processing format, for example, regarding signals from the switch 30, the mascon 40, the safety device 60, the wireless communication device 70, and the in-vehicle/out-vehicle guide device 80, the conversion processing unit 13 converts data formats thereof to obtain digital signals in an original format. Since the conversion processing unit 13 can grasp the signal type by the information on the signal type or the source address in the header, the conversion processing unit 13 converts the data format correspondingly to the signal type. Then, the conversion processing unit 13 outputs the signal after the data format conversion to the control unit 11.

The format of the Ethernet (registered trademark) frame used in the present application may be a general Ethernet (registered trademark) frame format defined by Institute of Electrical and Electronics Engineers (IEEE) 802.3.

The transmission/reception unit 14 is an apparatus-side transmission/reception unit which transmits and receives a signal in the network transmission format to and from a vehicle-mounted device via the network 110. Specifically, the transmission/reception unit 14 transmits a signal of the Ethernet (registered trademark) frame converted by the conversion processing unit 13 to the vehicle-mounted device via the network 110. At that time, the transmission/reception unit 14 transmits the signal of the Ethernet (registered trademark) frame in accordance with a procedure of Carrier Sense Multiple Access/Collision Detection (CSMA/CD) in Ethernet (registered trademark) communication defined by IEEE 802.3.

Figure 4:
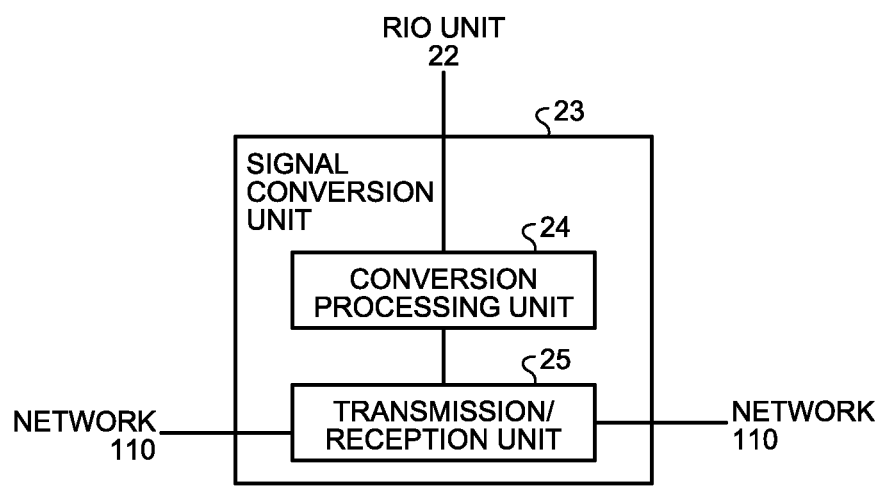
FIG. 4 is a block diagram illustrating a configuration example of a signal conversion unit included in a train radio device.

FIG. 4 is a block diagram illustrating a configuration example of the signal conversion unit 23 included in the train radio device 20 according to the embodiment of the present invention. The signal conversion units included in the vehicle-mounted devices such as the train radio device 20 and the switch 30 have configurations similar to each other. Here, as a description of a signal conversion unit included in a vehicle-mounted device, a description will be given using the signal conversion unit 23 included in the train radio device 20 as an example. The signal conversion unit 23 includes a conversion processing unit 24 and a transmission/reception unit 25.

The conversion processing unit 24 is a device-side conversion processing unit which converts a serial signal input from the RIO unit 22 into a signal in the network transmission format by performing data format conversion and transmission format conversion, and outputs the signal to the transmission/reception unit 25. In addition, the conversion processing unit 24 converts a signal in the network transmission format received by the transmission/reception unit 25 into a signal in an original format by performing transmission format conversion and data format conversion, and outputs the signal to the RIO unit 22.

Specifically, when a signal is input from the RIO unit 22, the conversion processing unit 24 first converts the signal input from the RIO unit 22 into an internal processing format for data conversion. With respect to signals converted into the internal processing format, for example, in a case where vehicle-mounted devices on each of which the conversion processing unit 24 is mounted are the train radio device 20 and the broadcasting device 90, the conversion processing unit 24 converts data formats thereof by protocol conversion. With respect to signals converted into the internal processing format, for example, in a case where vehicle-mounted devices on each of which the conversion processing unit 24 is mounted are the switch 30, the mascon 40, the safety device 60, the wireless communication device 70, and the in-vehicle/out-vehicle guide device 80, the conversion processing unit 24 converts data formats thereof to obtain digital signals in a format storable in a data portion of the Ethernet (registered trademark) frame after transmission format conversion described later. Then, the conversion processing unit 24 provides the data after the data format conversion with a header and the like to convert the data into an Ethernet (registered trademark) frame as the transmission format conversion, and outputs the Ethernet (registered trademark) frame to the transmission/reception unit 25. The conversion processing unit 24 provides information on a signal type, information on an address of the vehicle-mounted device in which the conversion processing unit 24 is included, that is, a source address, and the like, in the header.

When a signal in the network transmission format, that is, an Ethernet (registered trademark) frame is input from the transmission/reception unit 25, the conversion processing unit 24 first removes a header and the like from the Ethernet (registered trademark) frame input from the transmission/reception unit 25 to extract a data portion, and converts the data portion into the internal processing format. With respect to signals converted into the internal processing format, for example, in a case where vehicle-mounted devices on each of which the conversion processing unit 24 is mounted are the train radio device 20 and the broadcasting device 90, the conversion processing unit 24 converts data formats thereof by protocol conversion. With respect to signals converted into the internal processing format, for example, in a case where vehicle-mounted devices on each of which the conversion processing unit 24 is mounted are the switch 30, the display device 50, the safety device 60, the wireless communication device 70, and the in-vehicle/out-vehicle guide device 80, the conversion processing unit 24 converts data formats thereof to obtain digital signals in an original format. Since the conversion processing unit 24 can grasp the signal type by the information on the signal type or the source address in the header, the conversion processing unit 24 converts the data format correspondingly to the signal type. Then, the conversion processing unit 24 outputs the signal after the data format conversion to the RIO unit 22.

The transmission/reception unit 25 is a device-side transmission/reception unit which transmits and receives a signal in the network transmission format to and from the TCMS 10 via the network 110. Specifically, the transmission/reception unit 25 transmits a signal of the Ethernet (registered trademark) frame converted by the conversion processing unit 24 to the TCMS 10 via the network 110. The content of the operation of the transmission/reception unit 25 is similar to the content of the operation of the transmission/reception unit 14 of the TCMS 10 described above.

As described above, vehicle-mounted devices such as the train radio device 20 and the switch 30 each include an operation unit which outputs a signal generated by the function of the vehicle-mounted device in which the operation unit is included, operates based on a signal acquired from the TCMS 10, and operates differently depending on the type of vehicle-mounted device. The operation of each of operation units is similar to an operation of each of a general train radio device, a general switch, and the like, similar to conventional ones. The RIO unit is a general RIO circuit similar to conventional one. In the present embodiment, each vehicle-mounted device is configured by adding a signal conversion unit to the configuration of the operation unit and the RIO unit.

The TCMS 10 includes the control unit 11 which outputs a signal to be transmitted to a vehicle-mounted device and operates based on a signal acquired from a vehicle-mounted device. The operation of the control unit 11 is similar to an operation of a general TCMS similar to conventional one. In the present embodiment, a signal conversion unit is added to the control unit 11 to constitute the TCMS 10.

Next, operations of a vehicle-mounted device and the TCMS 10 when a signal is transmitted from the vehicle-mounted device to the TCMS 10 in the train communication system 100 will be described. Here, a description will be given using the train radio device 20 as an example of the vehicle-mounted device.

Figure 5:
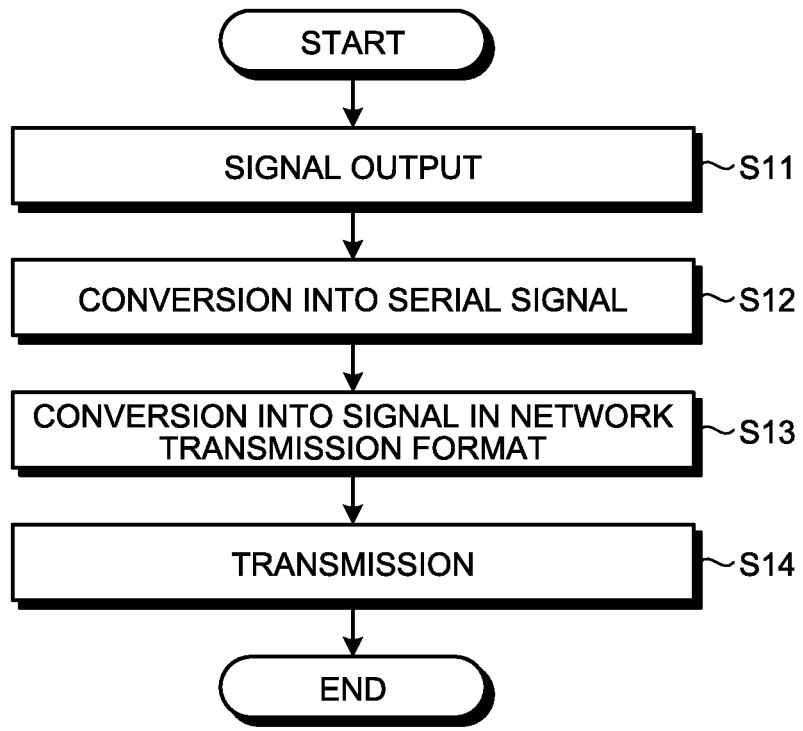
FIG. 5 is a flowchart illustrating an operation when the train radio device transmits a signal to the TCMS.

FIG. 5 is a flowchart illustrating an operation when the train radio device 20 according to the embodiment of the present invention transmits a signal to the TCMS 10.

First, in the train radio device 20, the train radio unit 21 outputs, to the RIO unit 22, a voice or data signal accepted by the operator's operation (Step S11).

The RIO unit 22 converts the signal input from the train radio unit 21 into a serial signal and outputs the serial signal to the signal conversion unit 23 (Step S12).

Figure 6:
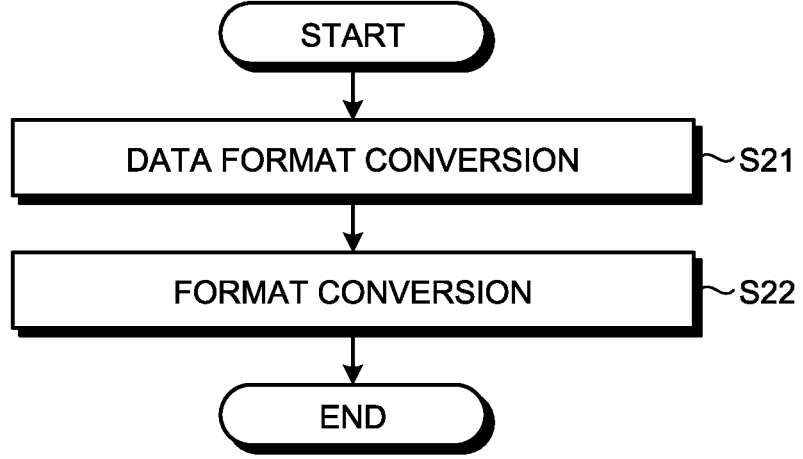
FIG. 6 is a flowchart illustrating a signal conversion process of a conversion processing unit of the train radio device.

The conversion processing unit 24 of the signal conversion unit 23 converts the serial signal input from the RIO unit 22 into a signal in a transmission format of the network 110, specifically, a signal of the Ethernet (registered trademark) frame as described above (Step S13). FIG. 6 is a flowchart illustrating a signal conversion process of the conversion processing unit 24 of the train radio device 20 according to the embodiment of the present invention. The conversion processing unit 24 converts a data format with respect to the serial signal input from the RIO unit 22 (Step S21). Then, the conversion processing unit 24 converts a format of the signal after the data format conversion into a format of the Ethernet (registered trademark) frame (Step S22).

Returning to the flowchart of FIG. 5, the transmission/reception unit 25 of the signal conversion unit 23 transmits the signal of the Ethernet (registered trademark) frame to the TCMS 10 via the network 110 (Step S14).

Figure 7:
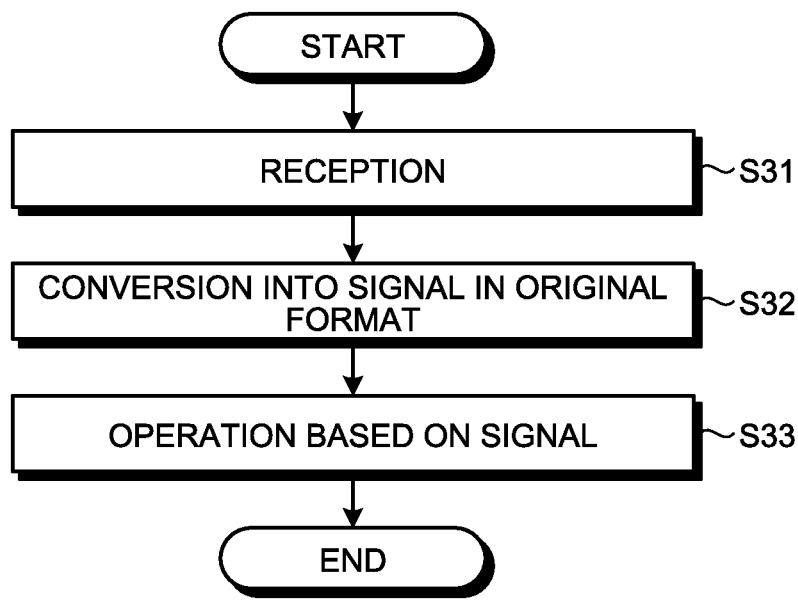
FIG. 7 is a flowchart illustrating an operation when the TCMS receives a signal transmitted from the train radio device.

FIG. 7 is a flowchart illustrating an operation when the TCMS 10 according to the embodiment of the present invention receives a signal transmitted from the train radio device 20.

First, in the TCMS 10, the transmission/reception unit 14 of the signal conversion unit 12 receives a signal of the Ethernet (registered trademark) frame transmitted from the train radio device 20 via the network 110 (Step S31).

Figure 8:
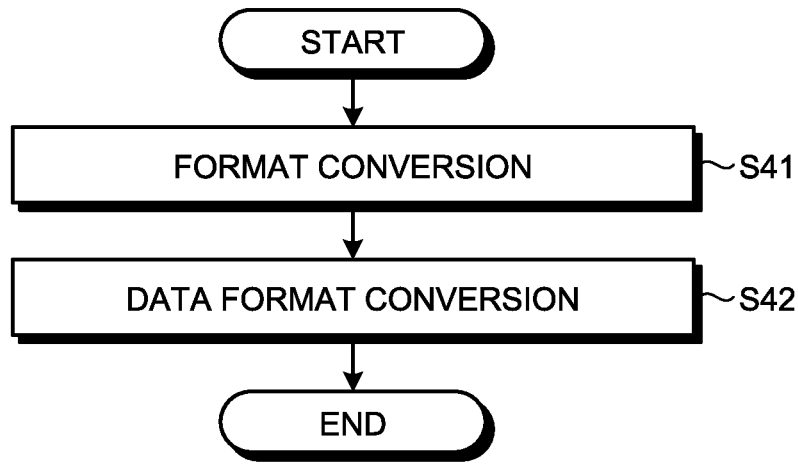
FIG. 8 is a flowchart illustrating a signal conversion process of a conversion processing unit of the TCMS.

The conversion processing unit 13 of the signal conversion unit 12 converts the signal of the Ethernet (registered trademark) frame received by the transmission/reception unit 14 into a signal in an original format (Step S32). FIG. 8 is a flowchart illustrating a signal conversion process of the conversion processing unit 13 of the TCMS 10 according to the embodiment of the present invention. The conversion processing unit 13 removes a header and the like from the received signal of the Ethernet (registered trademark) frame to extract a data portion, and converts the format of the signal (Step S41). Then, the conversion processing unit 13 converts the data format with respect to the extracted data portion (Step S42). Consequently, the conversion processing unit 13 converts the received signal of the Ethernet (registered trademark) frame into a signal in an original format before being converted in the train radio device 20. The conversion processing unit 13 outputs the signal converted into the original format to the control unit 11.

Returning to the flowchart of FIG. 7, the control unit 11 performs an operation based on the signal input from the conversion processing unit 13 of the signal conversion unit 12 (Step S33). In a case of an example using the train radio device 20, the control unit 11 performs control to transfer a signal received from the train radio device 20 to a ground-side operation management system or the like via the network 120.

Next, operations of the TCMS 10 and a vehicle-mounted device when a signal is transmitted from the TCMS 10 to the vehicle-mounted device in the train communication system 100 will be described. Here, similarly to the above-described example, a description will be given using the train radio device 20 as an example of the vehicle-mounted device.

Figure 9:
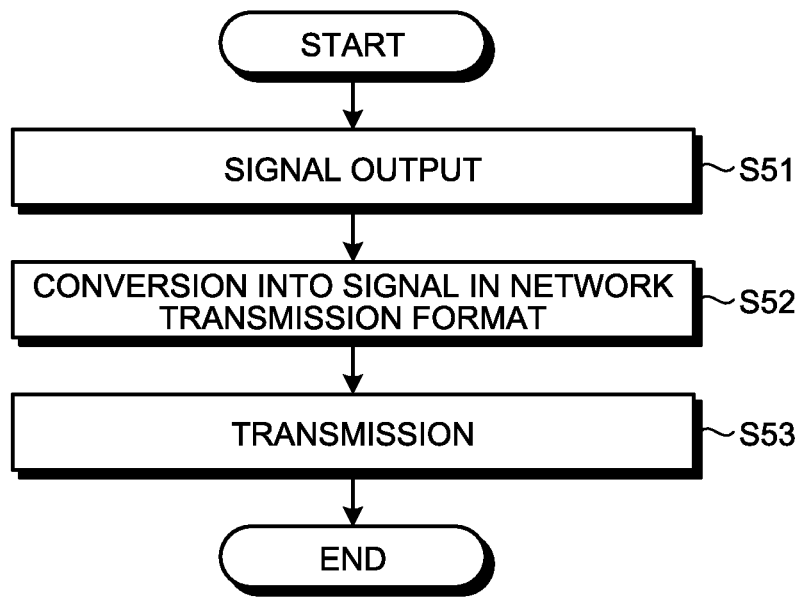
FIG. 9 is a flowchart illustrating an operation when the TCMS transmits a signal to the train radio device.

FIG. 9 is a flowchart illustrating an operation when the TCMS 10 according to the embodiment of the present invention transmits a signal to the train radio device 20.

First, in the TCMS 10, the control unit 11 outputs a signal addressed to the train radio device 20 input from the ground-side operation management system or the like via the network 120 to the signal conversion unit 12 (Step S51).

The conversion processing unit 13 of the signal conversion unit 12 converts the signal input from the control unit 11 into a signal in the transmission format of the network 110, specifically, a signal of the Ethernet (registered trademark) frame as described above (Step S52). Details of the operation of the conversion processing unit 13 are similar to the details of the operation of the conversion processing unit 24 of the train radio device 20 illustrated in FIG. 6.

The transmission/reception unit 14 of the signal conversion unit 12 transmits the signal of the Ethernet (registered trademark) frame to the train radio device 20 via the network 110 (Step S53).

Figure 10:
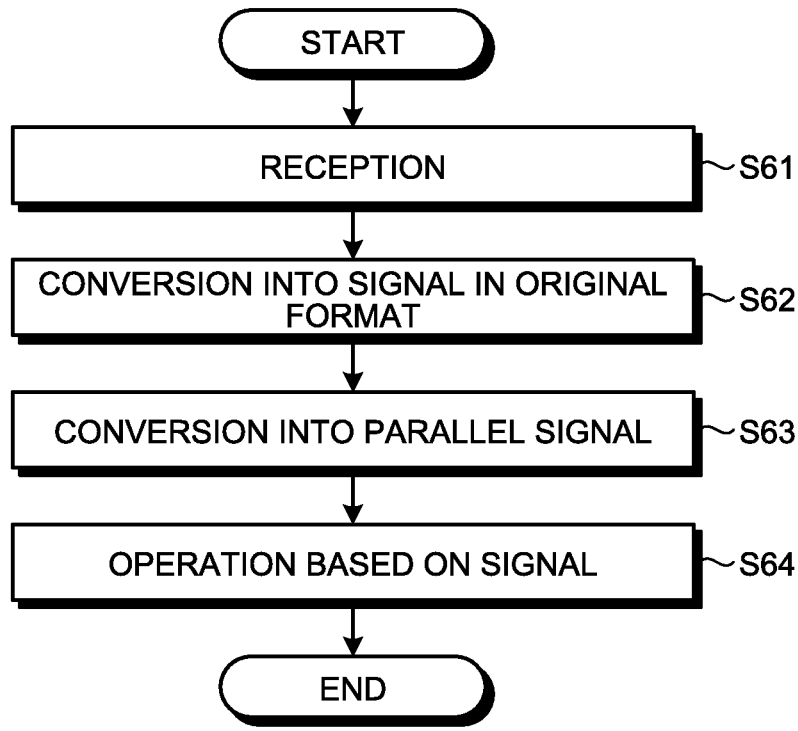
FIG. 10 is a flowchart illustrating an operation when the train radio device receives a signal transmitted from the TCMS.

FIG. 10 is a flowchart illustrating an operation when the train radio device 20 according to the embodiment of the present invention receives a signal transmitted from the TCMS 10.

First, in the train radio device 20, the transmission/reception unit 25 of the signal conversion unit 23 receives the signal of the Ethernet (registered trademark) frame transmitted from the TCMS 10 via the network 110 (Step S61).

The conversion processing unit 24 of the signal conversion unit 23 converts the signal of the Ethernet (registered trademark) frame received by the transmission/reception unit 25 into a signal in an original format (Step S62). Details of the operation of the conversion processing unit 24 are similar to the details of the operation of the conversion processing unit 13 of the TCMS 10 illustrated in FIG. 8. The conversion processing unit 24 outputs the signal converted into the original format to the RIO unit 22.

The RIO unit 22 converts the signal input from the conversion processing unit 24 into a parallel signal, and outputs the parallel signal to the train radio unit 21 (Step S63).

The train radio unit 21 performs an operation based on the parallel signal input from the RIO unit 22 (Step S64). Specifically, regarding the input parallel signal, the train radio unit 21 outputs the input parallel signal from a speaker or the like in a case where the signal is a voice signal, and displays the input parallel signal using a display device, a Light Emitting Diode (LED), or the like, in a case where the signal is a data signal.

Although the description has been given using the train radio device 20 as an example, the TCMS 10 can similarly transmit and receive signals to and from other vehicle-mounted devices including the switch 30. Similarly to the train radio device 20, other vehicle-mounted devices including the switch 30 can transmit and receive signals to and from the TCMS 10.

As illustrated in FIGS. 1 and 2, in the present embodiment, the train communication system 100 constitutes the ring-type network 110. The TCMS 10 is connected to the network 110 by one connection line, and can transmit and receive signals to and from each vehicle-mounted device. In the TCMS 10, even when the number of vehicle-mounted devices to be connected increases, it is not necessary to increase the number of terminals for connecting to the vehicle-mounted devices. Therefore, in the TCMS 10, even when the number of vehicle-mounted devices to be connected increases, the circuit scale can be suppressed and the size of the TCMS 10 can be prevented from increasing.

Figure 11:
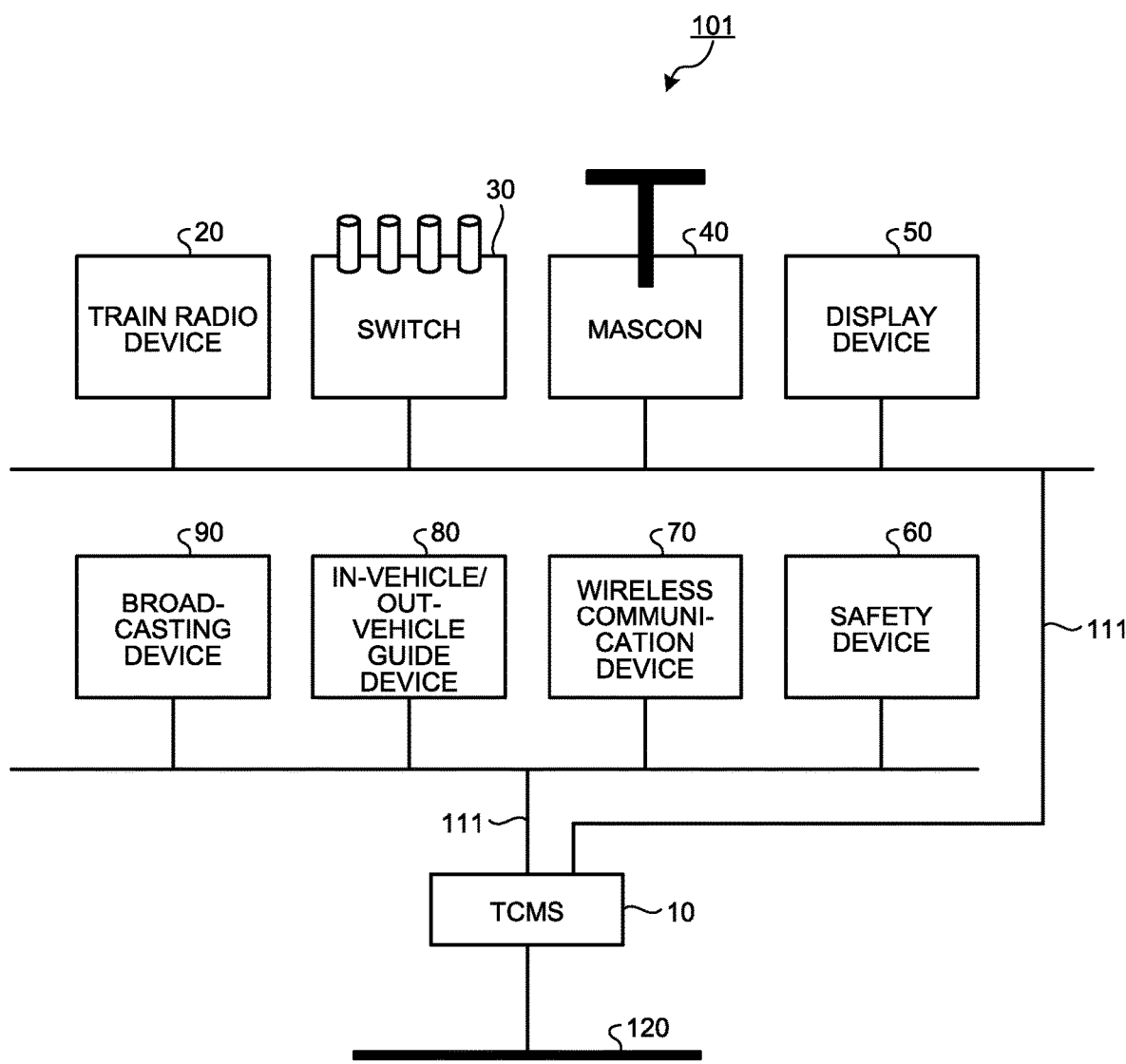
FIG. 11 is a diagram illustrating a configuration example of another train communication system.
Figure 12:
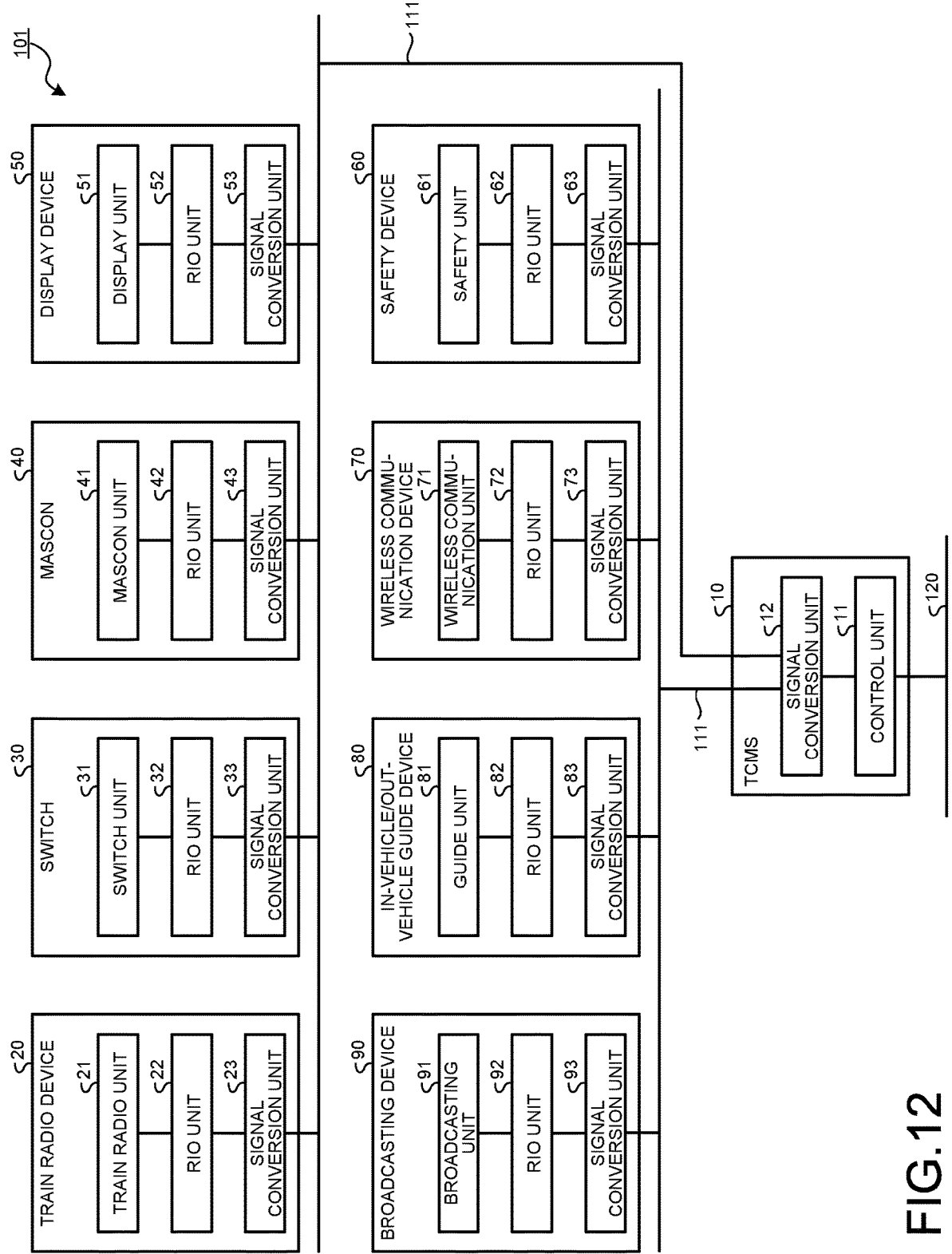
FIG. 12 is a block diagram illustrating a configuration example of a TCMS and each vehicle-mounted device constituting another train communication system.

The form of the network 110 of the train communication system 100 illustrated in each of FIGS. 1 and 2 is merely an example, and there is not limitation thereto. FIG. 11 is a diagram illustrating a configuration example of another train communication system 101 according to the embodiment of the present invention. FIG. 12 is a block diagram illustrating a configuration example of the TCMS 10 and each vehicle-mounted device constituting the other train communication system 101 according to the embodiment of the present invention. As illustrated in FIGS. 11 and 12, even when the network is formed into a bus-type network 111, an effect similar to the effect in a case of the ring-type network 110 can be obtained in the train communication system 101.

Next, hardware configurations of the TCMS 10 and each vehicle-mounted device will be described. In the TCMS 10, the control unit 11 is achieved by a circuit constituting the TCMS as described above. When the Ethernet (registered trademark) frame is used as in the example of the present embodiment, the transmission/reception unit 14 of the signal conversion unit 12 is achieved by an interface circuit capable of transmitting and receiving Ethernet (registered trademark) frames. The conversion processing unit 13 of the signal conversion unit 12 is achieved by a processing circuit. In each of the vehicle-mounted devices, operation units such as the train radio unit 21 and the switch unit 31 are achieved by a wireless communication circuit, a switch, and the like. The RIO unit is achieved by an RIO circuit, that is, a serial/parallel conversion circuit. When the Ethernet (registered trademark) frame is used as in the example of the present embodiment, the transmission/reception unit of the signal conversion unit is achieved by an interface circuit capable of transmitting and receiving Ethernet (registered trademark) frames. The conversion processing unit of the signal conversion unit is achieved by a processing circuit. That is, the TCMS 10 and each vehicle-mounted device include a processing circuit for converting a data format and converting a format of a signal. The processing circuit may be dedicated hardware, or a central processing unit (CPU) and a memory, the CPU executing a program stored in the memory.

Figure 13:
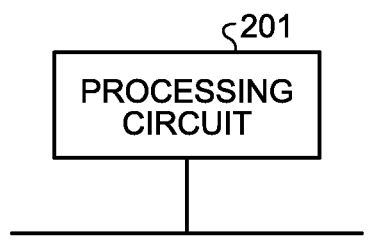
FIG. 13 is a diagram illustrating an example of a case where the conversion processing unit is configured with dedicated hardware.

FIG. 13 is a diagram illustrating an example of a case where the conversion processing unit according to the embodiment of the present invention is configured with dedicated hardware. When the processing circuit is dedicated hardware, a processing circuit 201 illustrated in FIG. 13 corresponds to, for example, a single circuit, a composite circuit, a programmed processor, a parallel programmed processor, an Application Specific Integrated Circuit (ASIC), a Field Programmable Gate Array (FPGA), or a combination thereof. The functions of the conversion processing unit may be achieved by the processing circuit 201 separately for each function, or the functions may be collectively achieved by the processing circuit 201.

Figure 14:
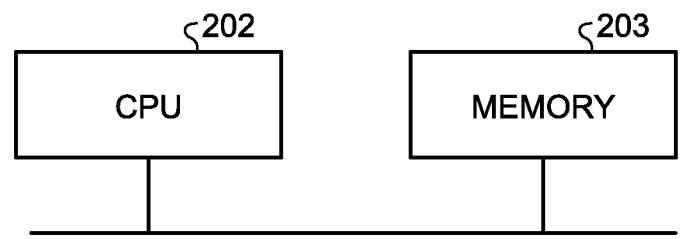
FIG. 14 is a diagram illustrating an example of a case where the conversion processing unit is configured with a CPU and a memory.

FIG. 14 is a diagram illustrating an example of a case where the conversion processing unit according to the embodiment of the present invention is configured with a CPU and a memory. When the processing circuit is configured with the CPU 202 and the memory 203, the function of the conversion processing unit is achieved by software, firmware, or a combination of software and firmware. The software or the firmware is described as a program and stored in the memory 203. In the processing circuit, the CPU 202 reads and executes the program stored in the memory 203, thereby achieving each function. That is, the TCMS 10 and each vehicle-mounted device include the memory 203 for storing programs. When these programs are executed by the processing circuit, a step of converting a data format and a step of converting a format of a signal are executed as a result. It can also be said that these programs cause a computer to execute procedures and methods of the conversion processing unit. Here, the CPU 202 may be a processing unit, an arithmetic unit, a microprocessor, a microcomputer, a processor, a Digital Signal Processor (DSP), or the like. The memory 203 corresponds to, for example, a non-volatile or volatile semiconductor memory such as a Random Access Memory (RAM), a Read Only Memory (ROM), a flash memory, an Erasable Programmable ROM (EPROM), or an Electrically EPROM (EEPROM), a magnetic disk, a flexible disk, an optical disk, a compact disc, a mini disk, or a Digital Versatile Disc (DVD).

A part of the functions of the conversion processing unit may be achieved by dedicated hardware and another part thereof may be achieved by software or firmware. For example, it is possible to achieve the function of converting a data format by the processing circuit 201 as dedicated hardware, and to achieve the function of converting a format of a signal by the CPU 202 reading and executing a program stored in the memory 203.

Thus, the processing circuit can achieve each of the above-described functions by dedicated hardware, software, firmware, or a combination thereof.

As described above, according to the present embodiment, in the train communication system 100, vehicle-mounted devices such as the train radio device 20 and the switch 30, and the TCMS 10 constitute a network of ring-type, bus-type, or the like, convert signals into a transmission format of the network, and transmit and receive the signals via the network. Consequently, in the TCMS 10, it is possible to reduce the number of wires when connecting to the vehicle-mounted devices. Since it is sufficient for the TCMS 10 to include terminals the number of which is equivalent to the number of networks to be connected, even when the number of vehicle-mounted devices to be connected increases, it is possible to suppress an increase in the circuit scale due to an increase in the number of terminals, and to prevent the size of the TCMS 10 from increasing.

The configuration described in the embodiment above indicates one example of the content of the present invention and can be combined with other known technology, and a part thereof can be omitted or modified without departing from the gist of the present invention.

REFERENCE SIGNS LIST

10 TCMS; 11 control unit; 12, 23, 33, 43, 53, 63, 73, 83, 93 signal conversion unit; 13, 24 conversion processing unit; 14, 25 transmission/reception unit; 20 train radio device; 21 train radio unit; 22, 32, 42, 52, 62, 72, 82, 92 RIO unit; 30 switch; 31 switch unit; 40 mascon; 41 mascon unit; 50 display device; 51 display unit; 60 safety device; 61 safety unit; 70 wireless communication device; 71 wireless communication unit; 80 in-vehicle/out-vehicle guide device; 81 guide unit; 90 broadcasting device; 91 broadcasting unit; 100, 101 train communication system; 110, 111, 120 network.

The invention claimed is:

1. A train communication system that performs communication between a vehicle-mounted device and a vehicle information controller, the train communication system comprising:
one or a plurality of the vehicle-mounted devices to convert a signal to the vehicle information controller into a signal in a network transmission format that is a format used for transmission over a network connectable by the plurality of the vehicle-mounted devices and transmit the signal via the network, and to convert a signal in the network transmission format received from the vehicle information controller via the network into a signal in an original format; and
the vehicle information controller to convert a signal to the vehicle-mounted device into a signal in the network transmission format and transmit the signal via the network, and to convert a signal in the network transmission format received from the vehicle-mounted device via the network into a signal in an original format,
wherein the vehicle-mounted device comprises:
an operator to output a signal generated by a function of the vehicle-mounted device in which the operator is included, and to operate based on a signal input from the vehicle information controller;
a serial/parallel converter to convert a signal generated by the operator into a serial signal and output the serial signal, and to convert a signal from the vehicle information controller into a parallel signal and output the parallel signal to the operator; and
a device-side signal converter to convert the serial signal input from the serial/parallel converter into a signal in the network transmission format, and to convert a signal received from the vehicle information controller via the network into a signal in an original format and output the signal to the serial/parallel converter.

2. The train communication system according to claim 1, wherein
the device-side signal converter comprises:
a device-side transceiver to transmit and receive a signal in the network transmission format to and from the vehicle information controller via the network; and
a device-side conversion processor to convert the serial signal input from the serial/parallel converter into a signal in the network transmission format and output the signal to the device-side transceiver, and to convert the signal in the network transmission format received by the device-side transceiver into a signal in an original format and output the signal to the serial/parallel converter.

3. The train communication system according to claim 1, wherein
the vehicle information controller comprises:
a controller to output a signal to be transmitted to the vehicle-mounted device and to perform an operation based on a signal input from the vehicle-mounted device; and
an apparatus-side signal converter to convert a signal input from the controller into a signal in the network transmission format, and to convert a signal received from the vehicle-mounted device via the network into a signal in an original format and output the signal to the controller.

4. The train communication system according to claim 3, wherein
the apparatus-side signal converter comprises:
an apparatus-side transceiver to transmit and receive a signal in the network transmission format to and from the vehicle-mounted device-via the network; and
an apparatus-side conversion processor to convert a signal input from the controller into a signal in the network transmission format and output the signal to the apparatus-side transceiver, and to convert the signal in the network transmission format received by the apparatus-side transceiver into a signal in an original format and output the signal to the controller.

5. The train communication system according to claim 1, wherein
the signal in the network transmission format is a signal of an Ethernet frame.

6. The train communication system according to claim 1, wherein
the network is a ring-type network or a bus-type network.

7. A vehicle-mounted device that constitutes a train communication system together with a vehicle information controller, the vehicle-mounted device comprising:
an operator to output a signal generated by a function of the vehicle-mounted device in which the operator is included, and to operate based on a signal input from the vehicle information controller;
a serial/parallel converter to convert a signal generated by the operator into a serial signal and output the serial signal, and to convert a signal from the vehicle information controller into a parallel signal and output the parallel signal to the operator; and
a device-side signal convertor to convert the serial signal input from the serial/parallel convertor into a signal in a network transmission format that is a format used for transmission over a network connectable by a plurality of vehicle-mounted devices, and to convert a signal received from the vehicle information controller via the network into a signal in an original format and output the signal to the serial/parallel convertor.

8. The vehicle-mounted device according to claim 7, wherein
the device-side signal convertor comprises:
a device-side transceiver to transmit and receive a signal in the network transmission format to and from the vehicle information controller via the network; and
a device-side conversion processor to convert the serial signal input from the serial/parallel converter into a signal in the network transmission format and output the signal to the device-side transceiver, and to convert the signal in the network transmission format received by the device-side transceiver into a signal in an original format and output the signal to the serial/parallel convertor.

9. The vehicle-mounted device according to claim 7, wherein
the signal in the network transmission format is a signal of an Ethernet frame.

10. The vehicle-mounted device according to claim 7, wherein
the network is a ring-type network or a bus-type network.

* * * * *